United States Patent
You et al.

(10) Patent No.: US 6,939,793 B1
(45) Date of Patent: Sep. 6, 2005

(54) DUAL DAMASCENE INTEGRATION SCHEME FOR PREVENTING COPPER CONTAMINATION OF DIELECTRIC LAYER

(75) Inventors: Lu You, San Jose, CA (US); Fei Wang, San Jose, CA (US); Christy Woo, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 60 days.

(21) Appl. No.: 10/422,784

(22) Filed: Apr. 25, 2003

Related U.S. Application Data

(62) Division of application No. 09/793,993, filed on Feb. 28, 2001, now Pat. No. 6,586,842.

(51) Int. Cl.[7] .......................................... H01L 21/4763
(52) U.S. Cl. ...................... 438/624; 438/627; 438/629; 438/633; 438/637; 438/687; 438/713
(58) Field of Search ............................... 438/627, 629, 438/624, 625, 633, 634, 637, 638, 640, 643, 672, 675, 687, 738, 713

(56) References Cited

U.S. PATENT DOCUMENTS

| | | | |
|---|---|---|---|
| 6,083,822 A | 7/2000 | Lee | 438/624 |
| 6,136,682 A | 10/2000 | Hegde et al. | 438/622 |
| 6,150,723 A | 11/2000 | Harper et al. | 257/762 |
| 6,465,889 B1 * | 10/2002 | Subramanian et al. | 257/760 |
| 6,576,982 B1 * | 6/2003 | You et al. | 257/639 |
| 6,577,009 B1 * | 6/2003 | You et al. | 257/751 |
| 6,663,787 B1 * | 12/2003 | You et al. | 216/18 |
| 6,677,679 B1 * | 1/2004 | You et al. | 257/758 |

* cited by examiner

*Primary Examiner*—Hsien-Ming Lee

(57) ABSTRACT

A semiconductor device includes a first metallization layer, a first diffusion barrier layer, a second etch stop layer, a first dielectric layer, a first etch stop layer, a second dielectric layer, a trench extending through the second dielectric layer and the first etch stop layer, and a via extending through the first dielectric layer, the second etch stop layer, and the first diffusion barrier layer. The first diffusion barrier layer is disposed over the first metallization layer. The second etch stop layer is disposed over and spaced from the first diffusion barrier layer, and the first dielectric layer is disposed over the second etch stop layer. The via can also have rounded corners. A third etch stop layer can also be disposed between the first diffusion barrier layer and the second etch stop layer. A sidewall diffusion barrier layer can be disposed on sidewalls of the via and trench, and the sidewall diffusion barrier layer is formed from the same material as the first diffusion barrier layer. A method of manufacturing the semiconductor device is also disclosed.

12 Claims, 14 Drawing Sheets

DUAL DAMASCENE INTEGRATION SCHEME FOR PREVENTING COPPER CONTAMINATION OF DIELECTRIC LAYER

This application is a divisional of application Ser. No. 09/793,993 filed Feb. 28, 2001 U.S. Pat. No. 6,586,842.

RELATED APPLICATION

This application contains subject matter related to the subject matter disclosed in U.S. patent application Ser. No. 09/785,445, filed on Feb. 20, 2001.

FIELD OF THE INVENTION

The present invention relates to the manufacturing of semiconductor devices, and more particularly, to copper and copper alloy metallization in semiconductor devices.

BACKGROUND OF THE INVENTION

The escalating requirements for high density and performance associated with ultra large scale integration (ULSI) semiconductor device wiring are difficult to satisfy in terms of providing sub-micron-sized, low resistance-capacitance (RC) metallization patterns. This is particularly applicable when the sub-micron-features, such as vias, contact areas, lines, trenches, and other shaped openings or recesses have high aspect ratios (depth-to-width) due to miniaturization.

Conventional semiconductor devices typically comprise a semiconductor substrate, usually of doped monocrystalline silicon (Si), and a plurality of sequentially formed dielectric interlayer dielectrics and electrically conductive patterns. An integrated circuit is formed therefrom containing a plurality of patterns of conductive lines separated by interwiring spacings, and a plurality of interconnect lines, such as bus lines, bit lines, word lines and logic interconnect lines. Typically, the conductive patterns of vertically spaced metallization layers are electrically interconnected by vertically oriented conductive plugs filling via holes formed in the interlayer dielectric layer separating the metallization layers, while other conductive plugs filling contact holes establish electrical contact with active device regions, such as a source/drain region of a transistor, formed in or on a semiconductor substrate. Conductive lines formed in trench-like openings typically extend substantially parallel to the semiconductor substrate. Semiconductor devices of such type according to current technology may comprise five or more levels of metallization to satisfy device geometry and microminiaturization requirements.

A commonly employed method for forming conductive plugs for electrically interconnecting vertically spaced metallization layers is known as "damascene"-type processing. Generally, this process involves forming an opening (or via) in the dielectric interlayer, which will subsequently separate the vertically spaced metallization layers. The via is typically formed using conventional lithographic and etching techniques. After the via is formed, the via is filled with a conductive material, such as tungsten (W), using conventional techniques. Excess conductive material on the surface of the dielectric interlayer is then typically removed by chemical mechanical planarization (CMP).

A variant of the above-described process, termed "dual damascene" processing, involves the formation of an opening having a lower contact (or via) hole section which communicates with an upper trench section. The opening is then filled with a conductive material to form a conductive plug that electrically contacts the lower metallization layer. As with the previous process, excess conductive material on the surface of the dielectric interlayer is then removed by CMP. An advantage of the dual damascene process is that the conductive plug and the upper metallization layer are formed simultaneously.

High performance microprocessor applications require rapid speed of semiconductor circuitry, and the integrated circuit speed varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. If the interconnection node is routed over a considerable distance, e.g., hundreds of microns or more, as in submicron technologies, the interconnection capacitance limits the circuit node capacitance loading and hence, the circuit speed. As integration density increases and feature size decreases, in accordance with submicron design rules, the rejection rate due to integrated circuit speed delays significantly reduces manufacturing throughput and increases manufacturing costs.

One way to increase the circuit speed is to reduce the resistance of a conductive pattern. Conventional metallization patterns are typically formed by depositing a layer of conductive material, notably aluminum (Al) or an alloy thereof, and etching, or by damascene techniques. Al is conventionally employed because it is relatively inexpensive, exhibits low resistivity and is relatively easy to etch. However, as the size of openings for vias/contacts and trenches is scaled down to the sub-micron range, step coverage problems result from the use of Al. Poor step coverage causes high current density and enhanced electromigration. Moreover, low dielectric constant polyamide materials, when employed as dielectric interlayers, create moisture/bias reliability problems when in contact with Al, and these problems have decreased the reliability of interconnections formed between various metallization layers.

One approach to improved interconnection paths in vias involves the use of completely filled plugs of a metal, such as W. Accordingly, many current semiconductor devices utilizing VLSI (very large scale integration) technology employ Al for the metallization layer and W plugs for interconnections between the different metallization levels. The use of W, however, is attendant with several disadvantages. For example, most W processes are complex and expensive. Furthermore, W has a high resistivity, which decreases circuit speed. Moreover, Joule heating may enhance electromigration of adjacent Al wiring. Still a further problem is that W plugs are susceptible to void formation, and the inferface with the metallization layer usually results in high contact resistance.

Another attempted solution for the Al plug interconnect problem involves depositing Al using chemical vapor deposition (CVD) or physical vapor deposition (PVD) at elevated temperatures. The use of CVD for depositing Al is expensive, and hot PVD Al deposition requires very high process temperatures incompatible with manufacturing integrated circuitry.

Copper (Cu) and Cu-based alloys are particularly attractive for use in VLSI an ULSI semiconductor devices, which require multi-level metallization layers. Cu and Cu-based alloy metallization systems have very low resistivities, which are significantly lower than W and even lower than those of previously preferred systems utilizing Al and its alloys. Additionally, Cu has a higher resistance to electromigration. Furthermore, Cu and its alloys enjoy a considerable cost advantage over a number of other conductive materials, notably silver (Ag) and gold (Au). Also, in contrast to Al and refractory-type metals (e.g., titanium (Ti), tantalum (Ta) and W), Cu and its alloys can be readily deposited at low temperatures formed by well-known "wet" plating techniques, such as electroless and electroplating techniques, at deposition rates fully compatible with the requirements of manufacturing throughput.

Electroless plating of Cu generally involves the controlled auto-catalytic deposition of a continuous film of Cu or an alloy thereof on a catalytic surface by the interaction of at least a Cu-containing salt and a chemical reducing agent contained in a suitable solution, whereas electroplating comprises employing electrons supplied to an electrode (comprising the surface(s) to be plated) from an external source (i.e., a power supply) for reducing Cu ions in solution and depositing reduced Cu metal atoms on the plating surface(s). In either case, a nucleation/seed layer is required for catalysis and/or deposition on the types of substrates contemplated herein. Finally, while electroplating requires a continuous nucleation/seed layer, very thin and discontinuous islands of a catalytic metal may be employed with electroless plating.

A number of different variations of a damascene process have been employed during semiconductor manufacturing. With reference to FIGS. 1A–1L, a dual damascene process for forming vias and a second metallization layer over a first metallization layer, according to conventional techniques, will be described. This process can be repeated to form multiple metallization levels, i.e., two or more, stacked one on top of another.

In FIG. 1A, a second etch stop layer 12 is deposited over a first metallization layer 10. The second etch stop layer 12 acts as a passivation layer that protects the first metallization layer 10 from oxidation and contamination and prevents diffusion of material from the metallization layer 10 into a subsequently formed dielectric layer. The second etch stop layer 12 also acts as an etch stop during subsequent etching of the dielectric layer. A typical material used as an etch stop is silicon nitride, and approximately 500 angstroms of silicon nitride is typically deposited over the metallization layer 10 to form the second etch stop layer 12. An illustrative process used for depositing silicon nitride is plasma enhanced CVD (PECVD).

In FIG. 1B, a first dielectric layer 14 is deposited over the second etch stop layer 12. The first dielectric layer 14 is generally formed from silicon oxide although other acceptable materials include silicon nitride and organic polymeric materials. Many techniques are capable of forming a dielectric layer 14 formed from silicon oxide, and an illustrative process is PECVD.

FIG. 1C, a first etch stop layer 40 is deposited over the first dielectric layer 14. The first etch stop layer 40 acts as an etch stop during etching of a dielectric layer subsequently formed over the first etch stop layer 40. As with the second etch stop layer 12, a material typically used as an etch stop is silicon nitride, and approximately 500 angstroms of silicon nitride is typically deposited over the first dielectric layer 40 to form the first etch stop layer 40. An illustrative process used for depositing silicon nitride is PECVD.

In FIG. 1D, a second dielectric layer 42 is deposited over the first etch stop layer 40. The second dielectric layer 42 is generally formed from silicon oxide although other acceptable materials include silicon nitride and organic polymeric materials. Many techniques are capable of forming a second dielectric layer 42 formed from silicon oxide, and an illustrative process is PECVD.

In FIG. 1E, the pattern of the vias are formed in the second dielectric layer 42 using conventional lithographic and etch techniques. The lithographic process involves depositing a resist 44 over the second dielectric layer 42 and exposing and developing the resist 44 to form the desired pattern of the vias. The first etch, which is highly selective to the material of the second dielectric layer 42, removes the second dielectric layer 42 until the etchant reaches the first etch stop layer 40. The first etch is typically an anisotropic etch, such as a reactive ion plasma dry etch, that removes only the exposed portions of the second dielectric layer 42 directly below the opening in the resist 44.

In FIG. 1F, a second etch, which is highly selective to the material of the first etch stop layer 40, then removes the first etch stop layer 40 until the etchant reaches the first dielectric layer 14. The second etch is also typically an anisotropic etch.

In FIG. 1G, the vias 16 are formed in the first dielectric layer 14 and the trenches 46 of the second metallization layer are formed in the second dielectric layer 42 using conventional lithographic and etch techniques. The lithographic process involves depositing a resist 50 over the second dielectric layer 42 and exposing and developing the resist 50 to form the desired pattern of the trenches 46. The third etch, which is highly selective to the material of the first and second dielectric layers 14, 42, removes the first dielectric layer 14 until the etchant reaches the second etch stop layer 12 and removes the second dielectric layer 42 until the etchant reaches the first etch stop layer 40. The third etch is typically an anisotropic etch, such as a reactive ion plasma dry etch, that removes only the exposed portions of the first dielectric layer 14 directly below the opening in the first etch stop layer 40 and the exposed portions of the second dielectric layer 42 directly below the opening in the resist 50. By using an anisotropic etch, the via 16 and the trench 46 can be formed with substantially perpendicular sidewalls.

In FIG. 1H, a fourth etch, which is highly selective to the material of the first and second etch stop layers 40, 12, then removes the second etch stop layer 12 until the etchant reaches the first metallization layer 10 and removes the first etch stop layer 40 until the etchant reaches the first dielectric layer 14. The fourth etch is also typically an anisotropic etch.

In FIG. 1I, the corners 18 of the vias 16 and trenches 46 can be rounded using a reverse sputtering process. The corners 18 of the vias 16 and trenches 46 are rounded to prevent problems of void creation associated with subsequent deposition of the conductive plug and second metallization layer, and if necessary, a barrier layer. The reverse sputtering process can also be used to clean the first metallization layer 10 at the bottom of the via 16. Incomplete etching of the second etch stop layer 12 can leave a portion of the second etch stop layer 12 over the first metallization layer 10, and this material can prevent good ohmic contact between the material of the conductive plug and the material of the first metallization layer 10. Use of the reverse sputtering process, however, can remove any remaining material of the second etch stop layer 12 and any other contaminants on the first metallization layer 10.

In FIG. 1J, an adhesion/barrier material, such as tantalum, titanium, tungsten, tantalum nitride, or titanium nitride, is deposited. The combination of the adhesion and barrier material is collectively referred to as a second diffusion barrier layer 20. The second diffusion barrier layer 20 acts to prevent diffusion into the first and second dielectric layers 14, 42 of the conductive material subsequently deposited into the via 16 and trench 46.

In FIG. 1K, a layer 22 of a conductive material, for example, a Cu or Cu-based alloy, is deposited in the via 16 and trench 46 and over the second dielectric layer 42. A typical process initially involves depositing a "seed" layer on the barrier layer 20 subsequently followed by conventional plating techniques, e.g., electroless or electroplating techniques, to fill the via 16 and trench 46. So as to ensure complete filling of the via 16 and trench 46, the Cu-containing conductive layer 22 is deposited as a blanket (or "overburden") layer 24 so as to overfill the trench 46 and cover the upper surface 52 of the second dielectric layer 42.

FIG. 1L, the entire excess thickness of the metal overburden layer 24 over the upper surface 52 of the second dielectric layer 42 is removed using a CMP process. A typical CMP process utilizes an alumina ($Al_2O_3$)-based slurry, which leaves a conductive plug in the via 16 and a second metallization layer in the trench 46. The second metallization layer has an exposed upper surface 58, which is substantially co-planar with the upper surface 52 of the second dielectric layer 42.

A problem that can be caused by the use of Cu and Cu-based alloys results from Cu having a relatively large diffusion coefficient into silicon oxide and silicon. Once Cu has diffused into these materials, Cu can cause the dielectric strength of these materials to decrease. Thus, if Cu from a plug or metallization layer diffuses into a silicon oxide layer, the layer can become more conductive, and this increase in conductivity can cause short circuits between adjacent conductive regions. These short circuits can therefore result in failure of the semiconductor device. For this reason, Cu conductors are encapsulated by at least one diffusion barrier to prevent diffusion of the Cu into the silicon oxide layer.

The above-described process, however, can still result in copper contamination as a result of the use of reverse physical sputtering to clean the first metallization layer and to round the corners of the trenches and vias. Reverse physical sputtering is a process by which atoms or molecules from the surface of a material are dislocated or removed by the impact energy of gas ions, which are accelerated in an electric field. This process involves the creation of a glow discharge or plasma between an anode and a cathode, such as a semiconductor device, wherein the current therebetween is composed of electron flow to the anode and positive ion flow to the cathode. The ions are created by the ionization of gas molecules, such as argon, existing within the flow discharge region between the anode and cathode. The ionization results from the collision of gas particles with the electron flow from the cathode to the anode. A focused beam of these ions can be directed to a very small point on a semiconductor device and then scanned, raster fashion, over a surface where material is to be removed. As an ion impinges on the semiconductor device surface, momentum is transferred from the ion to the impact surface resulting in the removal of one or more surface atoms.

The problem of copper contamination as a result of reverse sputtering is illustrated in FIG. 2. The reverse physical sputtering process rounds the corners 18 of the vias 16 and trenches 46 as a result of ionized argon impacting the corners 18 and dislodging atoms. As the atoms of argon are impacting the corners 18, the atoms of argon are also impacting all the other exposed surfaces, such as the Cu of the first metallization layer 10. Thus, the impact of the argon atoms onto the first metallization layer 10 also dislodges atoms of Cu, and the dislodged atoms of Cu are free to be redeposited on other surfaces. In particular, the dislodged Cu atoms can be deposited onto the exposed sidewall surfaces 15 of the first and second dielectric layers 14, 42.

Once the Cu is deposited on the first and second dielectric layers 14, 42, the Cu can then diffuse into the first and second layers 14, 42. As previously stated, the diffusion of Cu into a silicon oxide dielectric layer 14, 42 causes detrimental effects that can result in the failure of the semiconductor device. Accordingly, a need exists for an improved method of forming copper plugs and copper metallization that allows for use of reverse sputtering to round corners of vias, so as to minimize the problem of void creation, yet still prevent the dielectric layers from being contaminated with Cu.

SUMMARY OF THE INVENTION

This and other needs are met by embodiments of the present invention which provide a semiconductor device, which includes a first metallization layer, a first diffusion barrier layer, a second etch stop layer, a first dielectric layer, a first etch stop layer, a second dielectric layer, a trench, and a via. The first diffusion barrier layer is disposed over the first metallization layer. The second etch stop layer is disposed over and spaced from the first diffusion barrier layer, and the first dielectric layer is disposed over the second etch stop layer. Also, the first etch stop layer is disposed over the first dielectric layer, and the second dielectric layer is disposed over the first etch stop layer. The trench extends through the second dielectric layer and the first etch stop layer, and the via extends from the trench through the first dielectric layer, the second etch stop, and the first diffusion barrier layer to the first metallization layer. The via can also have rounded corners. A third etch stop layer can be disposed between the first diffusion barrier layer and the second etch stop layer. A sidewall diffusion barrier layer can also be disposed on sidewalls of the via and trench, and the sidewall diffusion barrier layer is formed from the same material as the first diffusion barrier layer.

By providing a first diffusion barrier layer to the material of the first metallization layer, the material of the first diffusion barrier layer can be subsequently sputtered onto the sidewalls of the via and the trench. The material deposited on the sidewalls forms a new sidewall diffusion barrier layer that prevents contamination of the dielectric layers caused by the material of the metallization layer being deposited on the sidewalls when this material is subsequently sputtered off. The sputtering process also advantageously provides the via and trench with round corners, which reduce the formation of voids in the via and trench.

In a further aspect of the invention, the material of the third etch stop layer can include silicon oxide, and the material of the second etch stop layer can include silicon nitride. Additionally, the material of the first diffusion barrier layer can include silicon nitride. Furthermore, the dielectric layers can be formed from silicon oxide, and the first metallization layer can include copper.

In still another aspect of the invention, a second diffusion barrier layer can be disposed over the sidewall diffusion barrier layer. Also, conductive material can be disposed within the via and trench, and the conductive material can include copper.

In an additional embodiment of the present invention, a semiconductor device comprises a first metallization layer; a first dielectric layer disposed over the first metallization layer; a second dielectric layer disposed over the first dielectric layer; a first sidewall diffusion barrier layer formed from a first material disposed on sidewalls of a via and trench; a second diffusion barrier layer formed from a second material disposed over the first sidewall diffusion barrier layer; and conductive material within the via and trench. The second material is different than the first material. Also, the trench extends through the second dielectric layer to the first dielectric layer, and the via extends from the trench through the first dielectric layer to the first metallization layer. The via can also have rounded corners.

In a further embodiment of the present invention, a method of manufacturing a semiconductor device is also disclosed. The method of manufacturing includes depositing a first diffusion barrier layer over a first metallization layer; depositing a first dielectric layer over the first diffusion barrier layer; depositing a second dielectric layer over the first dielectric layer; etching the first and second dielectric layers to form a via and a trench; and sputtering the first diffusion barrier layer. The trench is formed through the second dielectric layer, and the via is formed from the trench through the first dielectric layer. The sputtering rounds corners of the via and trench and also deposits material of the first diffusion barrier layer onto sidewalls of the via and trench to form a sidewall diffusion barrier layer.

In an additional aspect of the invention, the method can further include the steps of depositing a third etch stop layer between the first barrier diffusion layer and the first dielectric layer; depositing a second etch stop layer between the third etch stop layer and the first dielectric layer; depositing a first etch stop layer between the first dielectric layer and the second dielectric layer; and etching the first and second etch stop layers. A second diffusion barrier layer can also be deposited over the sidewall diffusion barrier layer, and a conductive material can then be deposited within the via and trench.

In still another embodiment of the present invention, an additional method of manufacturing a semiconductor device is disclosed. The method of manufacturing includes forming a first metallization layer; depositing a first diffusion barrier layer over the first metallization layer; depositing a third etch stop layer over the first barrier diffusion layer; depositing a second etch stop layer over the third etch stop layer; depositing a first dielectric layer over the second etch stop layer; depositing a first etch stop layer over the first dielectric layer; depositing a second dielectric layer over the first etch stop layer; depositing a first resist over the second dielectric layer; patterning the first resist; etching through the second dielectric layer with a first etch; etching through the first etch stop layer with a second etch; depositing a second resist over the second dielectric layer; patterning the second resist; etching through the first and second dielectric layers with a third etch; etching through the first and second etch stop layers with a fourth etch; sputtering the first diffusion barrier layer; depositing a conductive material in a via and a trench; and planarizing a top surface of the second dielectric layer. The etchings form the trench through the second dielectric layer and the first etch stop layer to the first dielectric layer and form the via from the trench through the first dielectric layer and the second etch stop layer to the third etch stop layer. The sputtering rounds corners of the via and trench and deposits material of the first diffusion barrier layer onto sidewalls of the via and trench to form a sidewall diffusion barrier layer. The conductive layer is deposited over the sidewall diffusion barrier layer.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DETAILED DESCRIPTION OF THE INVENTION

The present invention addresses and solves the problem of contamination from copper being deposited onto silicon oxide dielectric layers as a result of reverse physical sputtering, which is used to round corners of vias and trenches and to clean contaminants on the copper metallization layer below the via. This is achieved, in part, by providing a second etch stop layer, a third etch stop layer and a barrier layer below the third etch stop layer. Advantageously, after the second etch stop layer is removed using conventional etching techniques, the third etch stop layer and the barrier layer are sputtered off during the reverse physical sputtering process. Importantly, the material of the barrier layer that is sputtered off is then deposited onto the exposed portions of the dielectric layers and creates a sidewall diffusion barrier. This is accomplished before the copper from the copper layer is sputtered off onto the dielectric layers. Thus, once the copper layer is reached during the sputtering process and copper is then sputtered off, the copper will be deposited on a barrier layer and not on the dielectric layers.

Figure 1A:
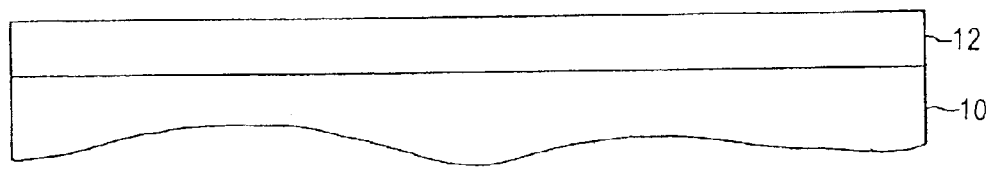
FIGS. 1A–1L schematically illustrate sequential phases of a conventional dual damascene process.
Figure 1B:
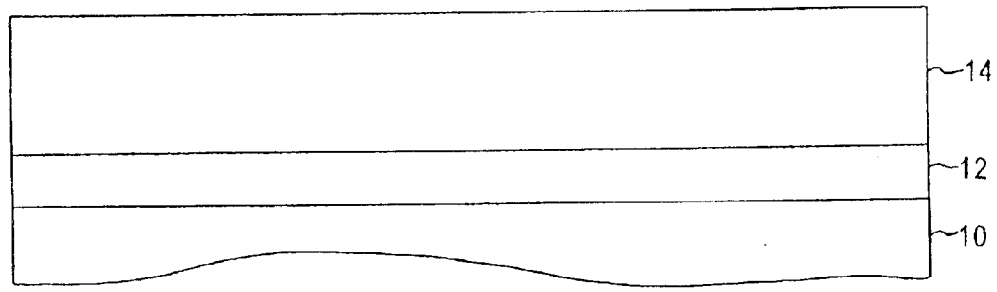
Figure 1C:
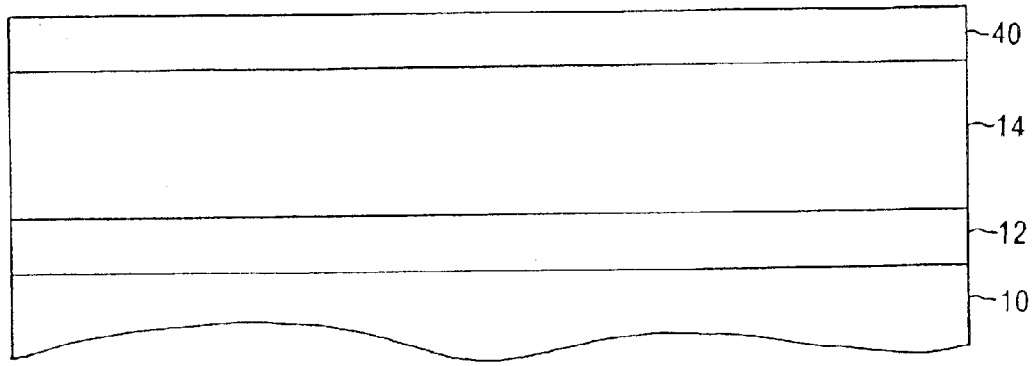
Figure 1D:
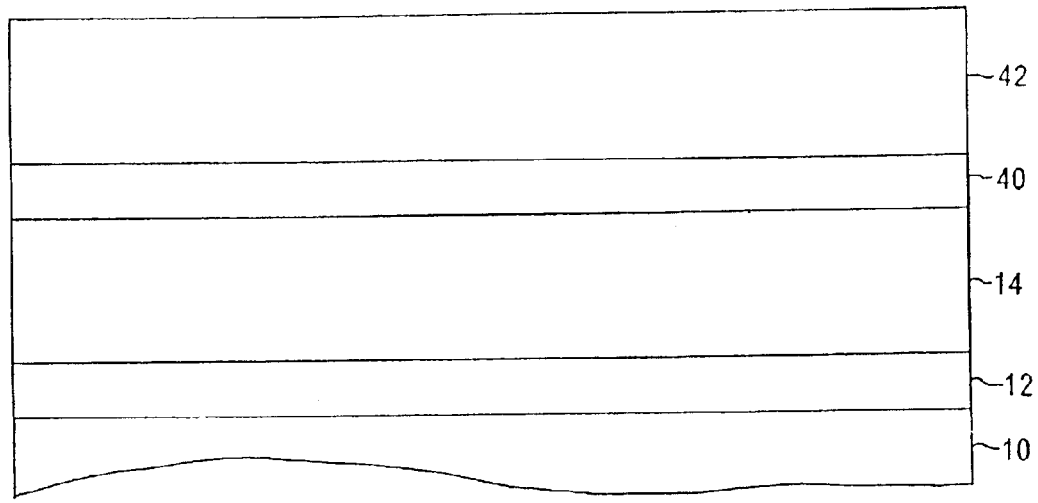
Figure 1E:
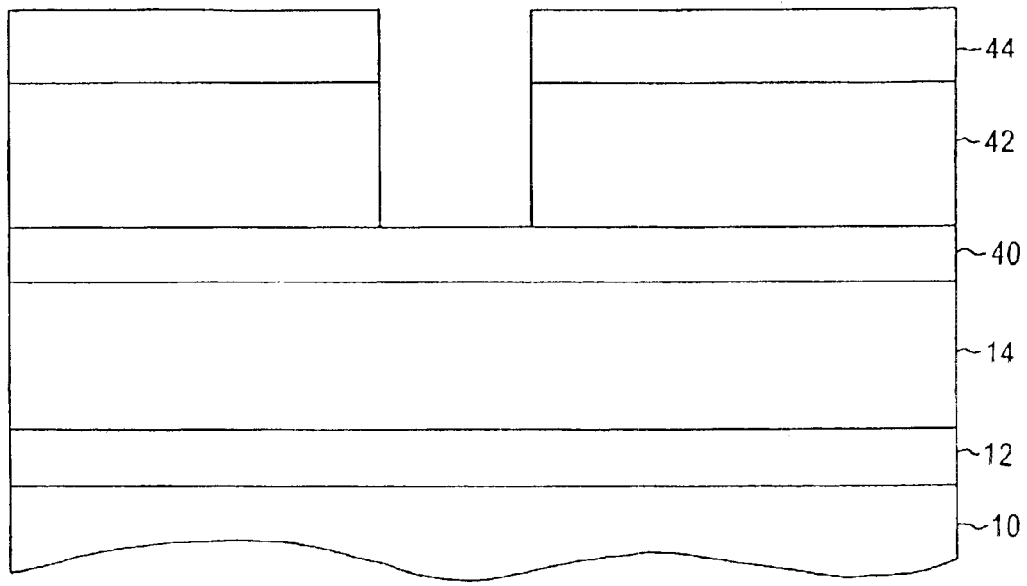
Figure 1F:
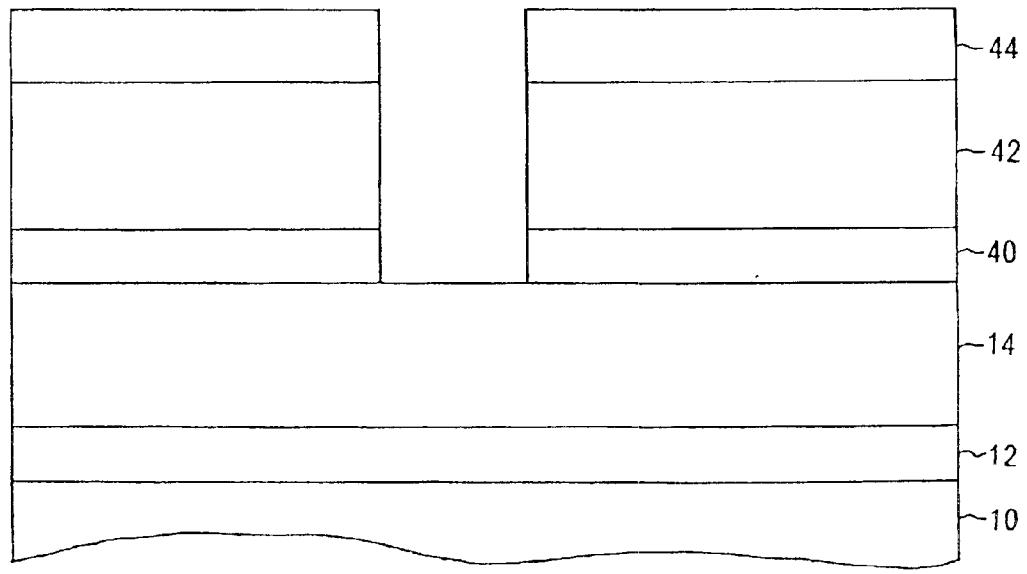
Figure 1G:
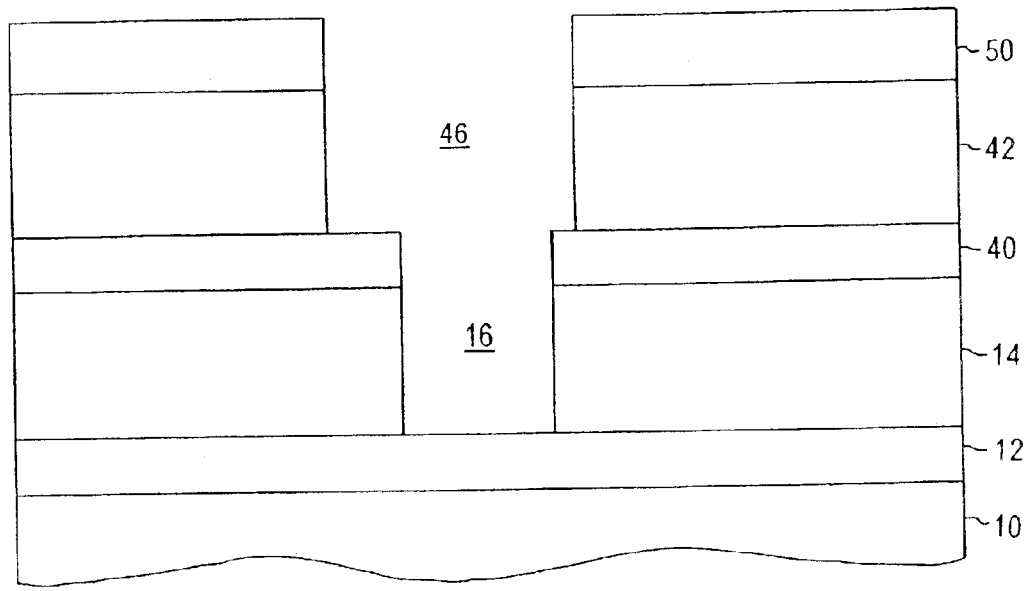
Figure 1H:
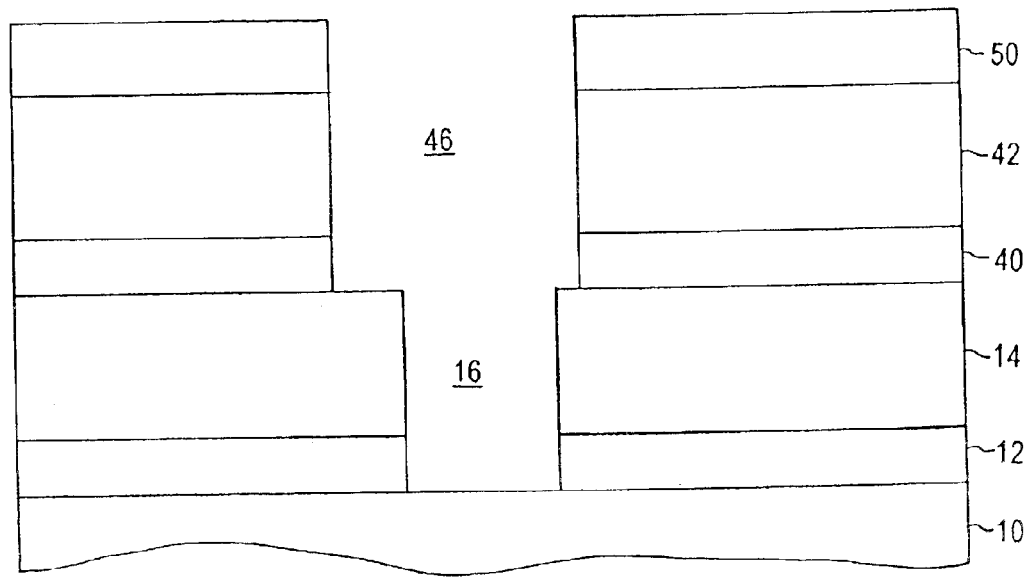
Figure 1I:
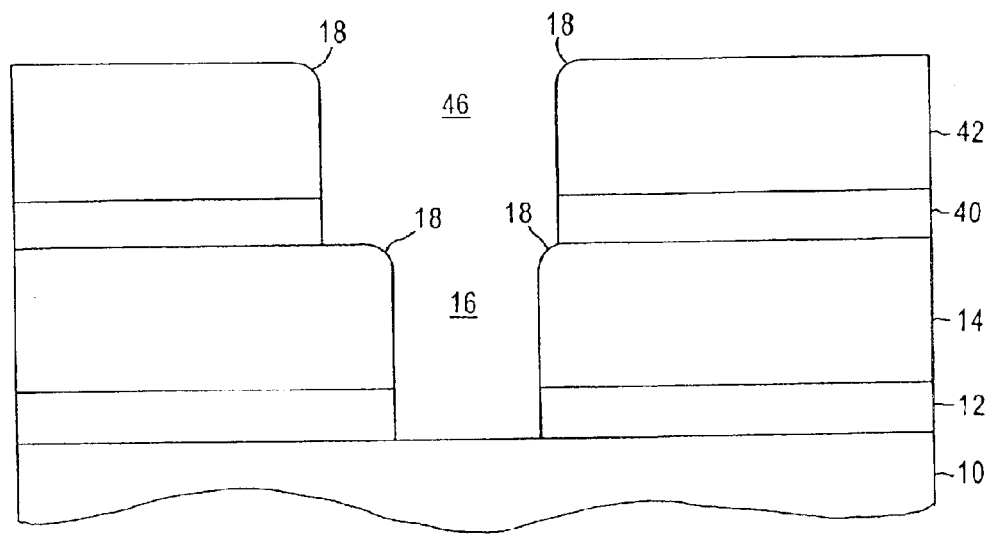
Figure 1J:
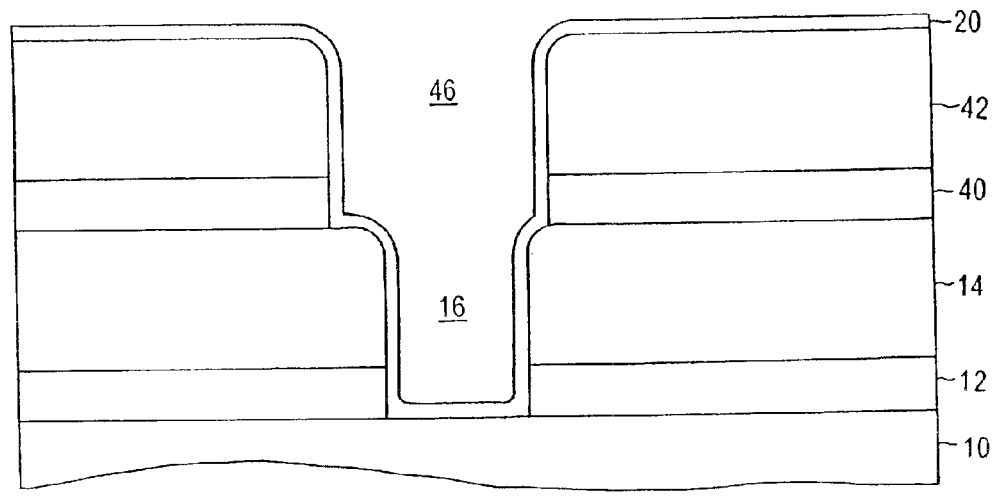
Figure 1K:
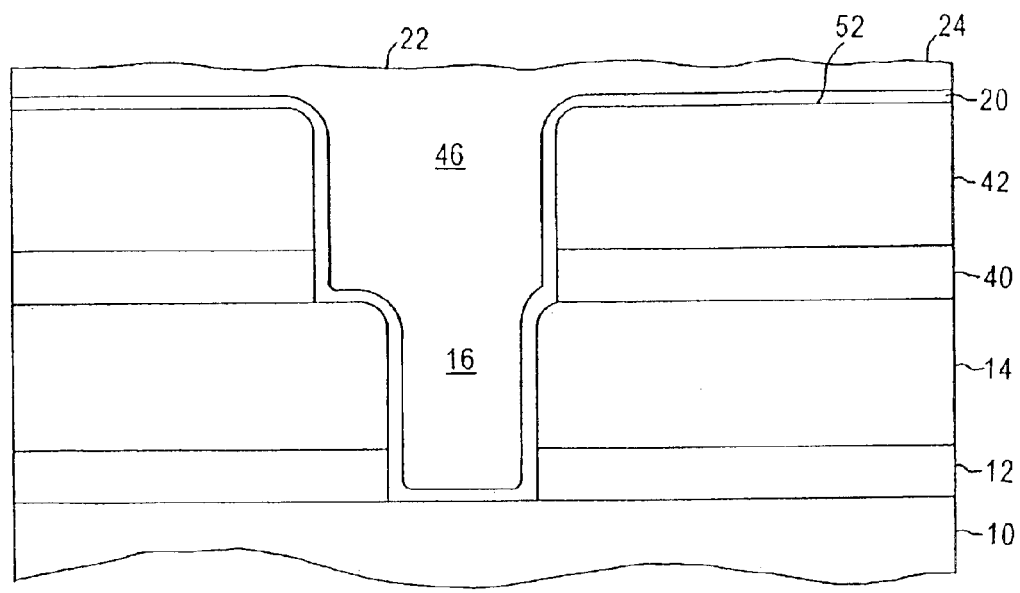
Figure 1L:
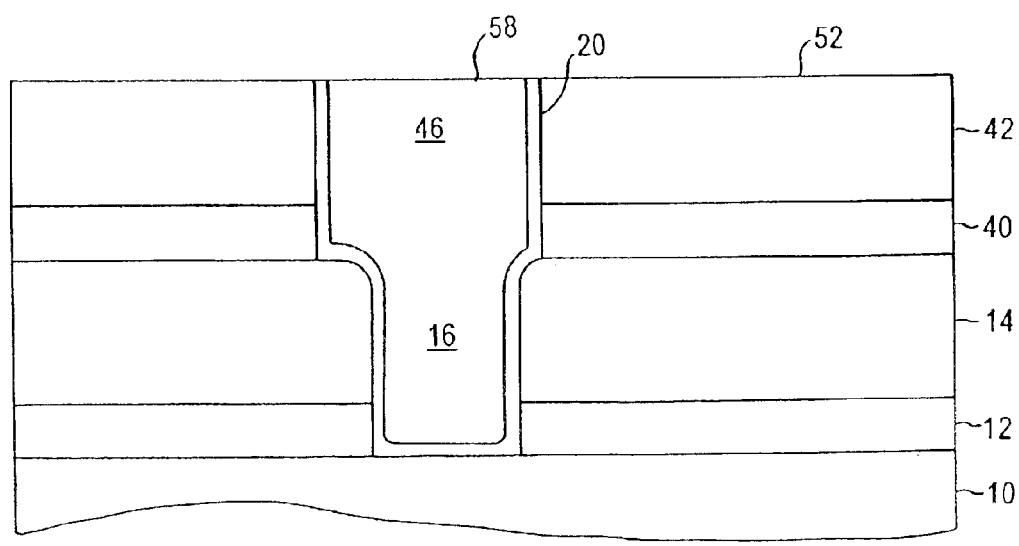
Figure 2:
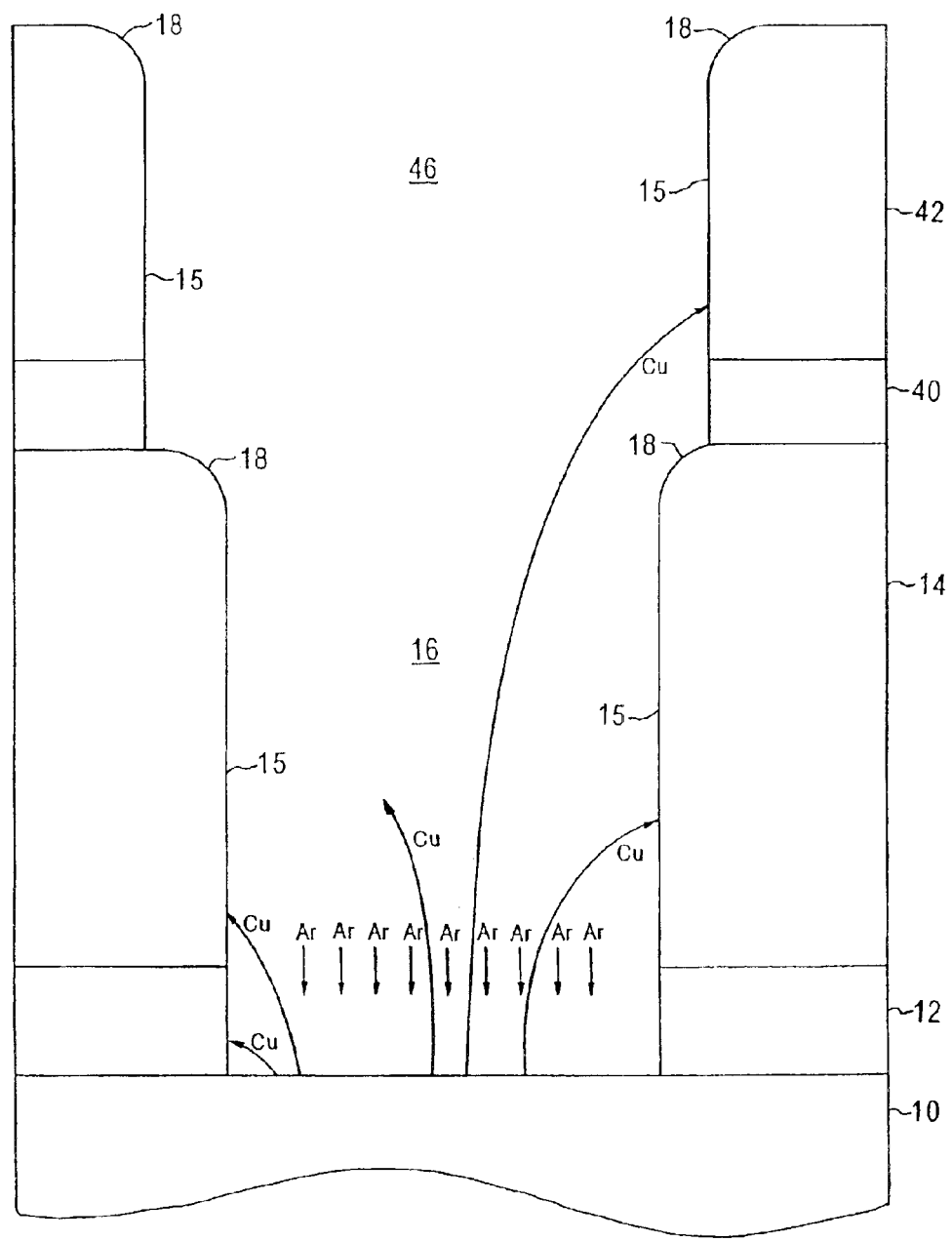
FIG. 2 illustrates a conventional via and trench during a sputtering process.
Figure 3A:
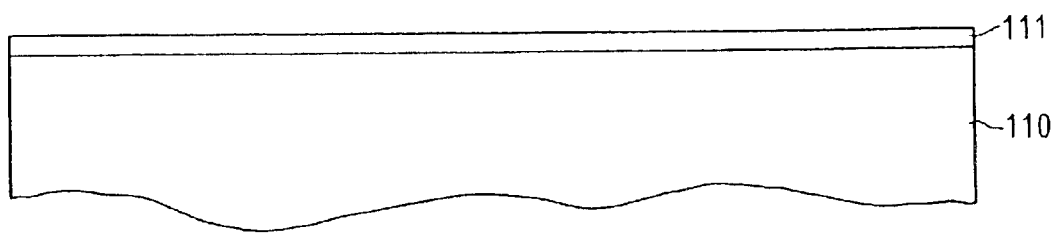
FIGS. 3A–3N schematically illustrate sequential phases of a dual damascene process according to an embodiment of the present invention.
Figure 3B:
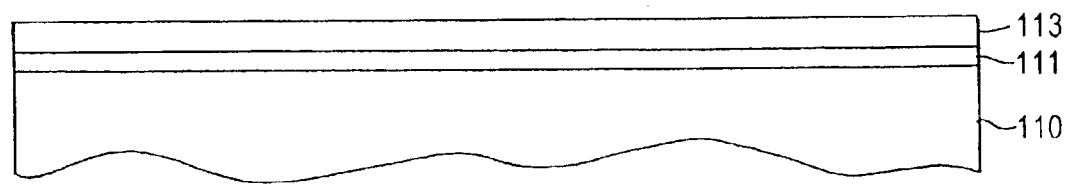
Figure 3C:
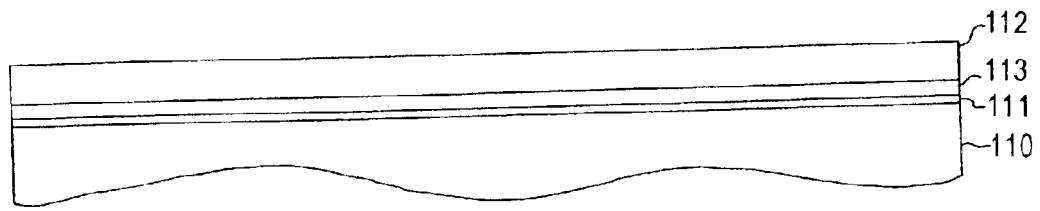
Figure 3D:
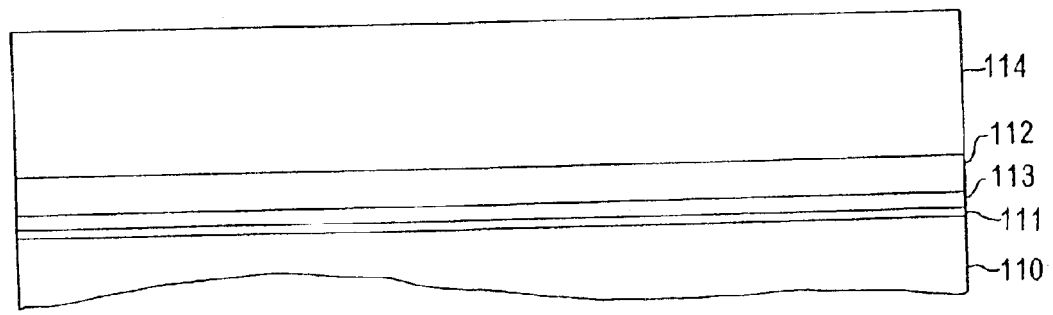
Figure 3E:
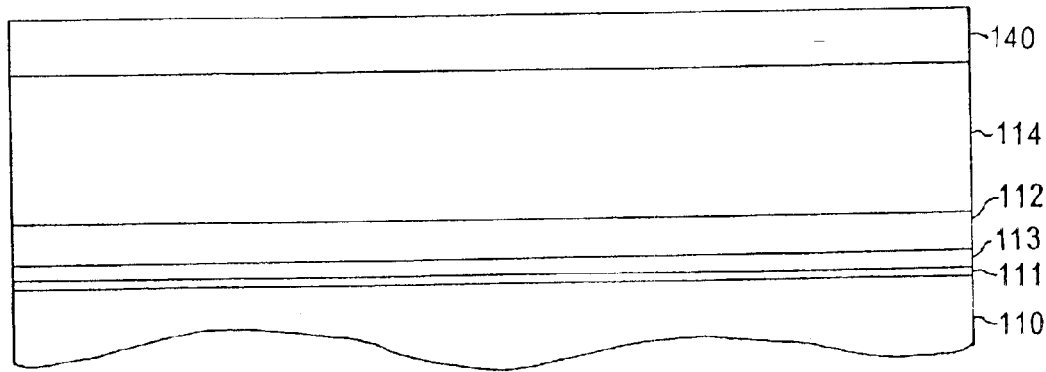
Figure 3F:
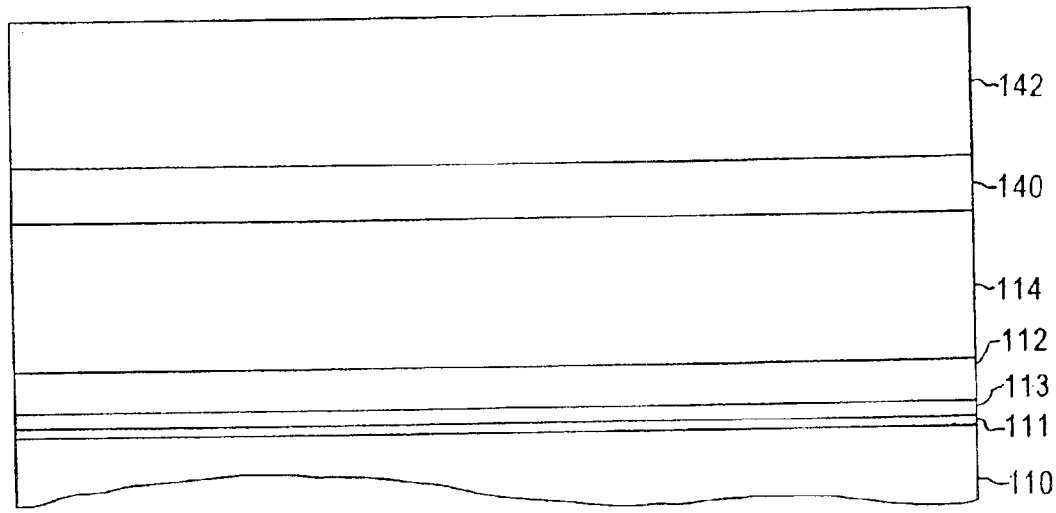
Figure 3G:
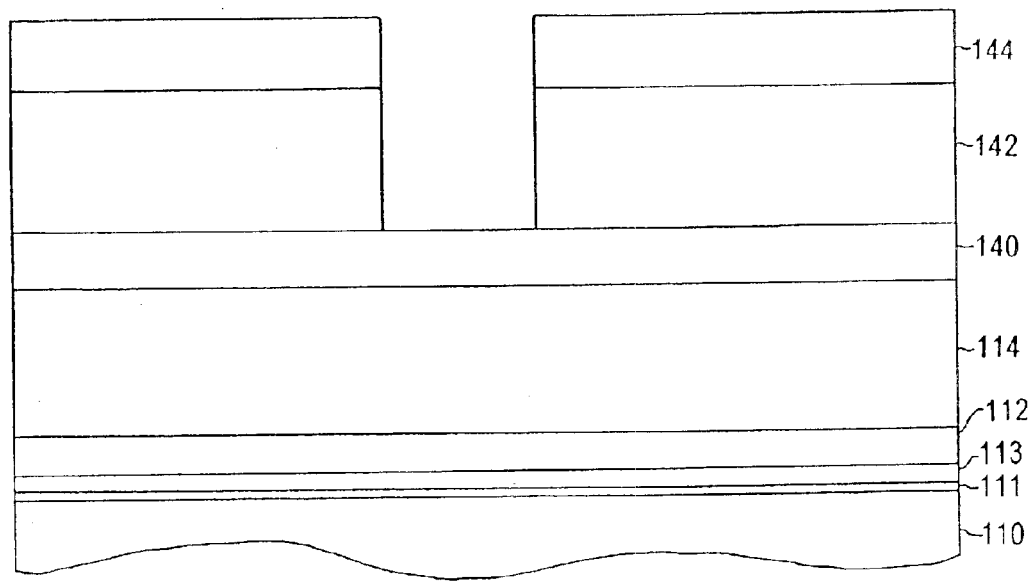
Figure 3H:
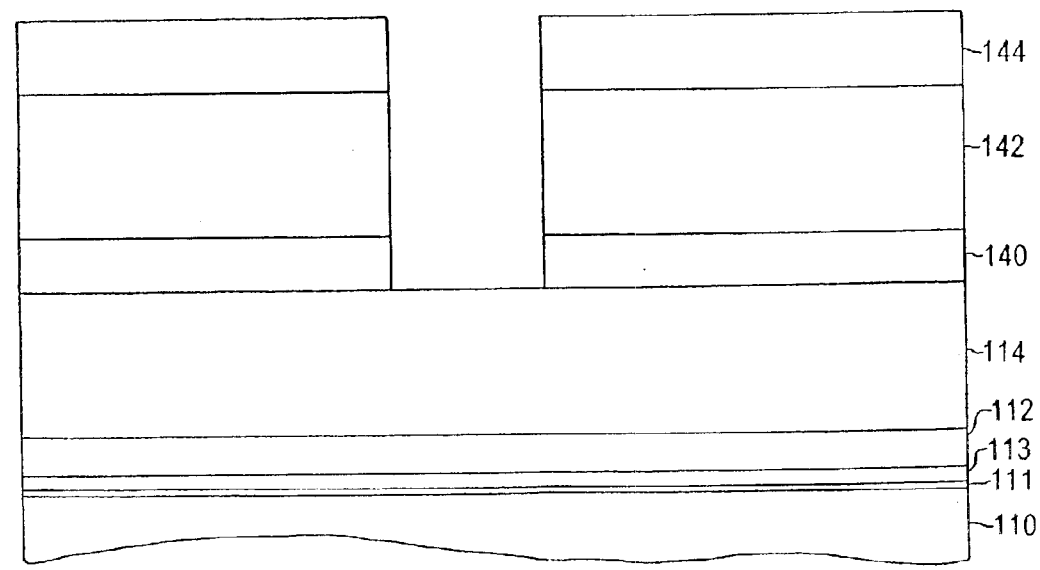
Figure 3I:
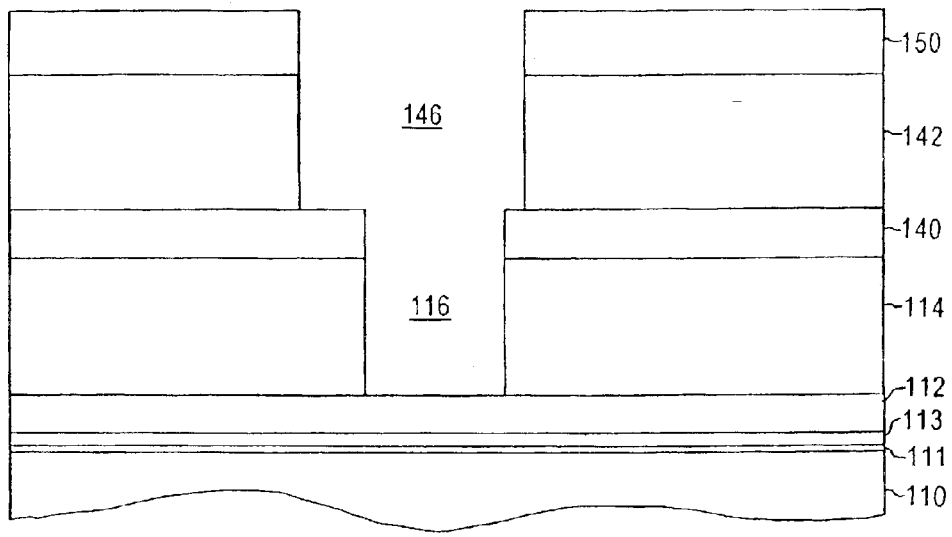
Figure 3J:
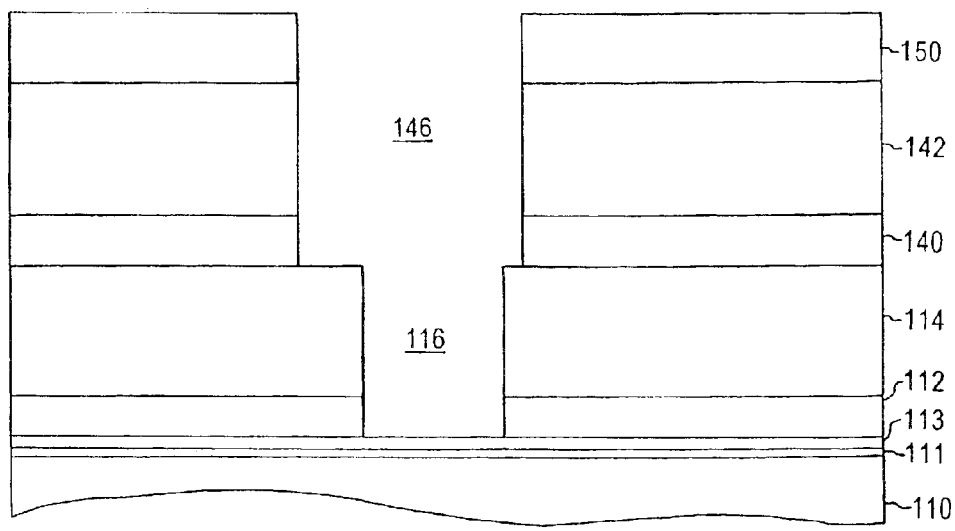
Figure 3K:
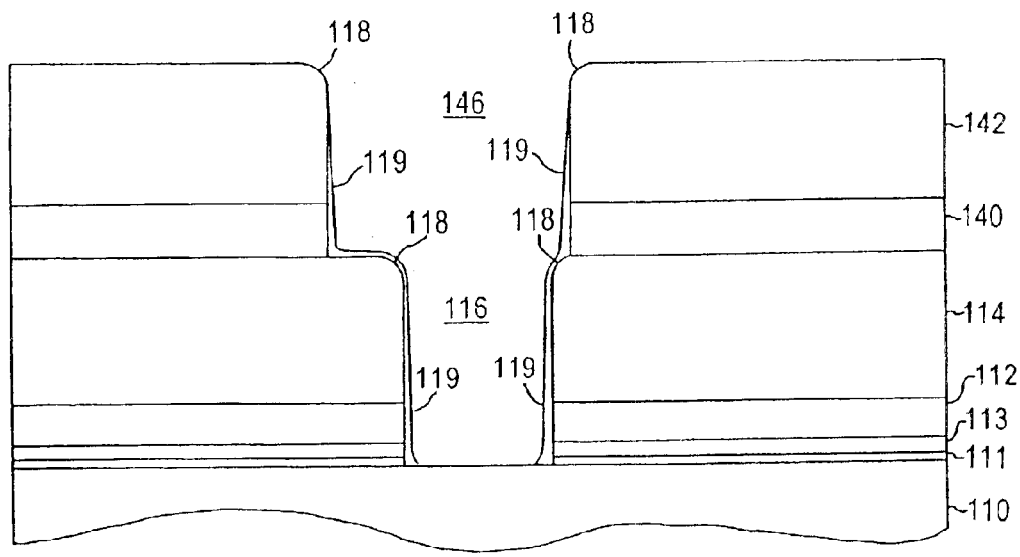
Figure 3L:
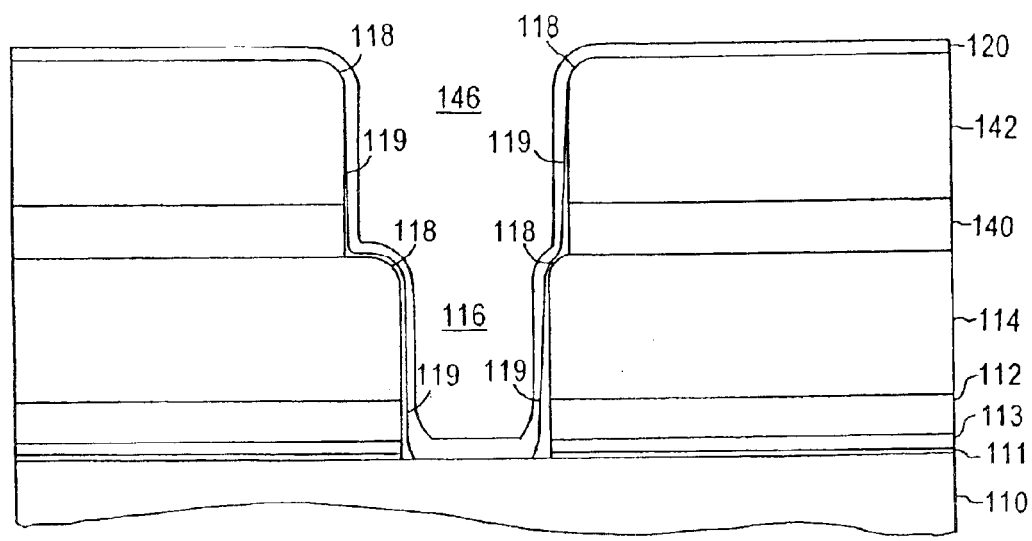
Figure 3M:
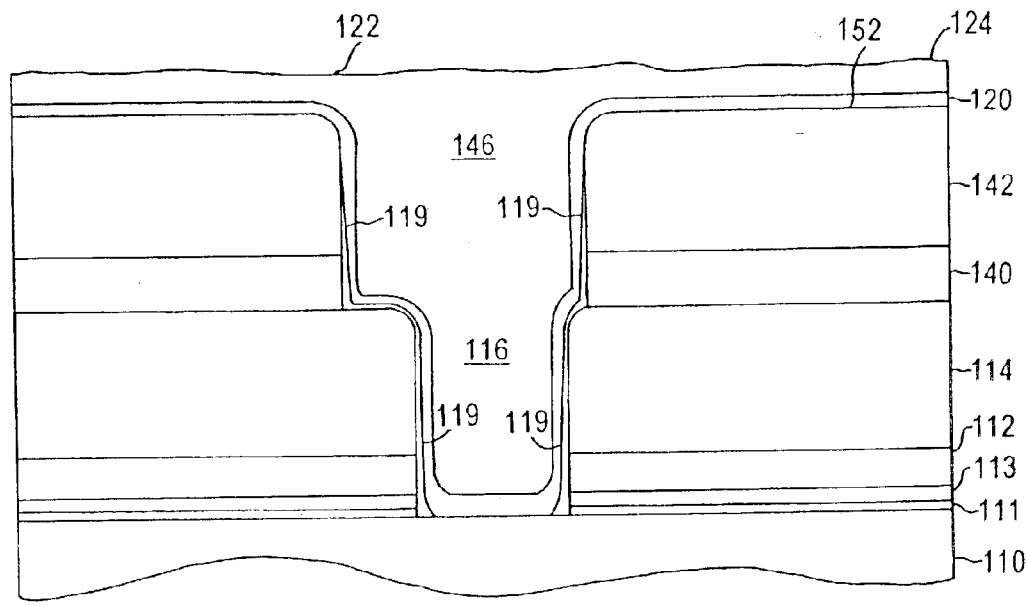
Figure 3N:
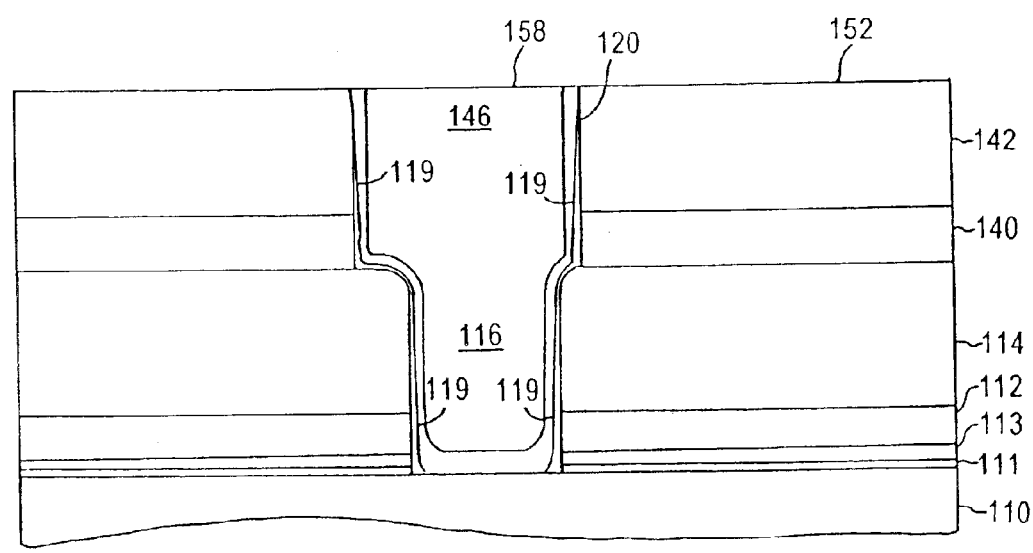

An embodiment of the present invention is illustrated in FIGS. 3A–3N. The dual damascene process to be described is illustrative of one sequence of steps, which can be used to practice the invention. In particular, the process provides a dual damascene structure, which includes a first metallization layer, over which first and second dielectric layers are disposed, and the first and second dielectric layers respectively include a via and trench filled with a conductive material. However, the invention is not limited as to particular sequence of steps described to provide the dual damascene structure, as other sequence of steps capable of providing the dual damascene structure can be used to practice the invention.

As illustrated in FIG. 3A, a first diffusion barrier layer 111 is formed over a first metallization layer 110. The first diffusion barrier layer 111 can be formed from any material that prevents diffusion of the material from the metallization layer 110 into a subsequently formed dielectric layer. For example, in current embodiments of the invention, the first metallization layer 110 is formed from a Cu or Cu-based allowy. As such, the preferred first diffusion barrier layer 111 for use with Cu or Cu-based alloys acts as a diffusion barrier to Cu. The first diffusion barrier layer 111 can also act as a passivation layer that protects the first metallization layer 110 from oxidation and contamination. The material of the first diffusion barrier layer 111 is also an etch stop for the etchant used to etch the material subsequently formed above the first diffusion barrier layer 111.

The thickness of the first diffusion barrier layer 111 depeneds upon several factors, which include the depth of a subsequently formed via and trench in the dielectric layers over the first diffusion barrier layer 111 and the percentage of the material of the first diffusion barrier layer 111 that is deposited onto the sidewalls of the dielectric layers. As such, the thickness of the first diffusion barrier layer 111 must be enough so that when the first diffusion barrier layer 111 is subsequently sputtered off, enough of the material of the first diffusion barrier layer 111 is deposited on the sidewalls of the dielectric layers to form an effective diffusion barrier from the material of the first metallization layer 110. In current embodiments of the invention, the thickness of the first diffusion barrier layer 111 is at least 50 angstroms.

In current embodiments of the invention, the first diffusion barrier layer 111 is formed from silicon nitride although the invention is not limited in this manner. Silicon nitride advantageously acts as a diffusion barrier to copper and also as a passivation layer. Furthermore, silicon nitride acts as an etch stop to an etchant that etches silicon oxide. Any process capable of depositing the first diffusion barrier layer 111 is acceptable for use with the invention, and an illustrative process for depositing silicon nitride is PECVD.

In FIG. 3B, a third etch stop layer 113 is deposited over the first diffusion barrier layer 111. The third etch stop layer 113 acts as an etch stop during etching of a second etch stop layer subsequently formed over the third etch stop layer 113. The thickness of the third etch stop layer 113 is preferably sufficient to act as an etch stop and not allow the etchant of the second etch stop layer to reach the first diffusion barrier layer 111. In current embodiments of the invention, the thickness of the third etch stop layer 113 is at least 50 angstroms and is preferably from about 80 to about 120 angstroms.

In current embodiments of the invention, the third etch stop layer 113 is formed from silicon oxide although the invention is not limited in this manner. Silicon oxide advantageously acts as an etch stop to an etchant that etches silicon nitride. Any process capable of depositing the third etch stop layer 113 is acceptable for use with the invention, and an illustrative process for depositing silicon oxide is CVD.

In FIG. 3C, a second etch stop layer 112 is deposited over the third etch stop layer 113. The second etch stop layer 112 acts as an etch stop during subsequent etching of the dielectric layer formed above the second etch stop layer 112. In current embodiments of the invention, the second etch stop layer 112 is formed from silicon nitride although the invention in not limited in this manner. The thickness of the second etch stop layer 112 is preferably sufficient to act as an etch stop during etching of the dielectric layer. In current embodiments of the invention, the thickness of the second etch stop layer 112 is at least 50 angstroms and is preferably from about 400 to about 600 angstroms. Any process capable of depositing the second etch stop layer 112 is acceptable for use with the invention, and an illustrative process for depositing silicon nitride is PECVD.

In FIG. 3D, a first dielectric layer 114 is deposited over the second etch stop layer 112. The first dielectric layer 114 is generally formed from silicon oxide although other acceptable materials include silicon nitride and organic polymeric materials. Many techniques are capable of providing a dielectric layer 114 formed from silicon oxide, and an illustrative process for depositing silicon oxide is PECVD.

In FIG. 3E, a first etch stop layer 140 is deposited over the first dielectric layer 114. The first etch stop layer 140 acts as an etch stop during subsequent etching of the dielectric layer formed above the first etch stop layer 140. In current embodiments of the invention, the first etch stop layer 140 is formed from silicon nitride although the invention in not limited in this manner. The thickness of the first etch stop layer 140 is preferably sufficient to act as an etch stop during etching of the dielectric layer. In current embodiments of the invention, the thickness of the first etch stop layer 140 is at least 50 angstroms and is preferably from about 400 to about 600 angstroms. Any process capable of depositing the first etch stop layer 140 is acceptable for use with the invention, and an illustrative process for depositing silicon nitride is PECVD.

FIG. 3F, a second dielectric layer 142 is deposited over the first etch stop layer 140. The second dielectric layer 142 is generally formed from silicon oxide although other acceptable materials include silicon nitride and organic polymeric materials. Many techniques are capable of providing a dielectric layer 142 formed from silicon oxide, and an illustrative process for depositing silicon oxide is PECVD.

In FIG. 3G, the pattern of the vias are formed in the second dielectric layer 142 using conventional lithographic and etch techniques. The lithographic process involves depositing a resist 144 over the second dielectric layer 142 and exposing and developing the resist 144 to form the desired pattern of the vias. The first etch, which is highly selective to the material of the second dielectric layer 142, removes the second dielectric layer 142 until the etchant reaches the first etch stop layer 140. The first etch is typically an anisotropic etch, such as a reactive ion plasma dry etch, that removes only the exposed portions of the second dielectric layer 142 directly below the opening in the resist 144.

In FIG. 3H, a second etch, which is highly selective to the material of the first etch stop layer 140, then removes the first etch stop layer 140 until the etchant reaches the first dielectric layer 114. The second etch is also typically an anisotropic etch.

In FIG. 3I, the vias 116 are formed in the first dielectric layer 114 and the trenches 146 of the second metallization layer are formed in the second dielectric layer 142 using conventional lithographic and etch techniques. The lithographic process involves depositing a resist 150 over the second dielectric layer 142 and exposing and developing the resist 150 to form the desired pattern of the trenches 146. The third etch, which is highly selective to the material of the first and second dielectric layers 114, 142, removes the first dielectric layer 114 until the etchant reaches the second etch stop layer 112 and removes the second dielectric layer 142 until the etchant reaches the first etch stop layer 140. The third etch is typically an anisotropic etch, such as a reactive ion plasma dry etch, that removes only the exposed portions of the first dielectric layer 114 directly below the opening in the first etch stop layer 140 and the exposed portions of the second dielectric layer 142 directly below the opening in the resist 150. By using an anisotropic etch, the via 116 and the trench 146 can be formed with substantially perpendicular sidewalls.

In FIG. 3J, a fourth etch, which is highly selective to the material of the first and second etch stop layers 140, 112, then removes the second etch stop layer 112 until the etchant reaches the third etch stop layer 113 and removes the first etch stop layer 140 until the etchant reaches the first dielectric layer 114. The fourth etch is also typically an anisotropic etch.

In FIG. 3K, a reverse sputtering process is employed to etch through the third etch stop layer 113 and the first diffusion barrier layer 111 to expose the first metallization layer 110. After the third etch stop layer 113 has been removed, the sidewalls of the via 116 and trench 146 include material from the third etch stop layer 113. During the sputtering of the first diffusion barrier layer 111, material of the first diffusion barrier layer 111 liberated during the sputtering process is deposited on the sidewalls of the via 116 and trench 146. The material of the first diffusion barrier layer 111 deposited on the sidewalls of the via 116 and trench 146 forms a sidewall diffusion barrier layer 119. This sidewall diffusion barrier layer 119 acts as a diffusion barrier that prevents the material of the first metallization layer 110 from diffusing into the first and second dielectric layers 114, 142 after the sputtering process reaches the level of the first metallization layer 110 and the material of the first metallization layer 110 is sputtered off.

The reverse sputtering process also advantageously rounds the corners 118 of the via 116 and trench 146. The corners 118 of the via 116 and trench 146 are rounded to prevent problems associated with subsequent deposition of the conductive plug and second metallization layer, and if necessary, a barrier layer. For example, when the material of the conductive plug or the barrier layer is deposited in a via 116 or trench 146 having sharp corners 118, the material tends to build up more quickly at the corners 118 than at the vertical sidewalls of the via 116 and trench 146. Consequentially, the material at opposing corners 118 can form cantilevered bridges that eventually meet in the middle of the via 116 or trench 146. When this occurs, the via 116 or trench 146 is blocked and further deposition of material within the via 116 or trench 146 is prevented, thereby leaving a void in the via 116 or trench 146. The creation of such a void can disadvantageously cause a malfunction in the semiconductor device. However, by rounding the corners 118 of the via 116 and trench 146, excess buildup of material at the corners 118 is counteracted and the problem of void creation is reduced.

The reverse sputtering process can also be used to clean the first metallization layer 110 at the bottom of the via 116. As such, any dielectric material or contaminants formed over the first metallization layer 110 can be removed by the reverse sputtering process to allow for good ohmic contact between the material of the conductive plug and the material of the first metallization layer 110.

In FIG. 3L, an adhesion/barrier material, such as tantalum, titanium, tungsten, tantalum nitride, or titanium nitride, is deposited in the via 116 and trench 146 and over the sidewall diffusion barrier layer 119. The combination of the adhesion and barrier material is collectively referred to as a second diffusion barrier layer 120. The second diffusion barrier layer 120 acts to prevent diffusion into the first and second dielectric layers 114, 142 of the conductive material subsequently deposited into the via 116 and trench 146.

In FIG. 3M, a layer 122 of a conductive material is deposited into the via 116 and trench 146 and over the second dielectric layer 142. In current embodiments of the invention, the conductive material is a Cu or Cu-based alloy, and any process capable of depositing Cu into the via 116 and trench 146 is acceptable for use with this invention. An illustrative example of a process acceptable for use with this invention involves depositing a "seed" layer on the second diffusion barrier layer 120. After the seed layer has been formed, conventional plating techniques, e.g., electroless or electroplating techniques, are used to fill the via 116 and trench 146. So as to ensure complete filling of the via 116 and trench 146, the Cu-containing conductive layer 122 is deposited as a blanket (or "overburden") layer 124 so as to overfill the trench 146 and cover the upper surface 152 of the second dielectric layer 142.

FIG. 3N, the entire excess thickness of the metal overburden layer 124 over the upper surface 152 of the second dielectric layer 142 is removed using a CMP process. A typical CMP process utilizes an alumina ($Al_2O_3$)-based slurry, which leaves a conductive plug in the via 116 and a second metallization layer in the trench 146. The second metallization layer has an exposed upper surface 158, which is substantially co-planar with the upper surface 152 of the second dielectric layer 142.

By providing a barrier layer above a copper metallization layer, the material of the barrier layer can be subsequently sputtered onto the sidewalls of a via and trench. The barrier material deposited onto the sidewalls during sputtering forms a new barrier layer that advantageously prevents copper contamination of the dielectric layers caused by copper being deposited onto the sidewalls when copper from the copper metallization layer is also subsequently sputtered off. The sputtering process also advantageously provides a via and trench with round corners, which reduce the formation of voids in the via or trench.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device, comprising the steps of:
   depositing a first diffusion barrier layer over a first metallization layer;
   depositing a first dielectric layer over the first diffusion barrier layer;
   depositing a second dielectric layer over the first dielectric layer;
   etching the first and second dielectric layers to form a trench through the second dielectric layer and to form a via from the trench through the first dielectric layer;
   sputtering the first diffusion barrier layer,
   wherein said sputtering rounds corners of the via and trench and deposits material of the first diffusion barrier layer onto sidewalls of the via and trench to form a sidewall diffusion barrier layer.

2. The method of manufacturing a semiconductor device according to claim 1, wherein the first diffusion barrier layer includes silicon nitride.

3. The method of manufacturing a semiconductor device according to claim 2, wherein the first metallization layer includes copper and the first and second dielectric layers include silicon oxide.

4. The method of manufacturing a semiconductor device according to claim 1, further comprising the steps of:
- depositing a third etch stop layer between the first barrier diffusion layer and the first dielectric layer;
- depositing a second etch stop layer between the third etch stop layer and the first dielectric layer;
- depositing a first etch stop layer between the first dielectric layer and the second dielectric layer; and
- etching the first and second etch stop layers.

5. The method of manufacturing a semiconductor device according to claim 1, further comprising depositing a second diffusion barrier layer over the sidewall diffusion barrier layer.

6. The method of manufacturing a semiconductor device according to claim 5, further comprising depositing conductive material within the via and trench.

7. The method of manufacturing a semiconductor device according to claim 6, wherein the conductive material includes copper.

8. The method of manufacturing a semiconductor device according to claim 4, wherein the second etch stop layer includes silicon nitride and the third etch stop layer includes silicon oxide.

9. A method of manufacturing a semiconductor device, comprising the steps of:
- forming a first metallization layer;
- depositing a first diffusion barrier layer over the first metallization layer;
- depositing a third etch stop layer over the first diffusion barrier layer;
- depositing a second etch stop layer over the third etch stop layer;
- depositing a first dielectric layer over the second etch stop layer;
- depositing a first etch stop layer over the first dielectric layer;
- depositing a second dielectric layer over the first etch stop layer;
- depositing a first resist over the second dielectric layer;
- patterning the first resist;
- etching through the second dielectric layer with a first etch;
- etching through the first etch stop layer with a second etch;
- depositing a second resist over the second dielectric layer;
- patterning the second resist;
- etching through the first and second dielectric layers with a third etch;
- etching through the first and second etch stop layers with a fourth etch, said etchings forming a trench through the second dielectric layer and the first etch stop layer to the first dielectric layer and forming a via from the trench through the first dielectric layer and the second etch stop layer to the third etch stop layer;
- sputtering the first diffusion barrier layer, said sputtering rounding corners of the via and trench and depositing material of the first diffusion barrier layer onto sidewalls of the via and trench to form a sidewall diffusion barrier layer;
- depositing a conductive material in the via and trench and over the sidewall diffusion barrier layer; and
- planarizing a top surface of the second dielectric layer.

10. The method of manufacturing a semiconductor device according to claim 9, wherein the first metallization layer and the conductive material include copper.

11. The method of manufacturing a semiconductor device according to claim 10, further comprising the step of depositing a second diffusion barrier layer over the sidewall diffusion barrier layer.

12. The method of manufacturing a semiconductor device according to claim 9, wherein the first diffusion barrier layer includes silicon nitride.

\* \* \* \* \*